United States Patent
Lin et al.

(10) Patent No.: US 10,905,022 B2
(45) Date of Patent: Jan. 26, 2021

(54) METHOD OF MANUFACTURING CLAD METAL CASING

(71) Applicant: ASUSTeK COMPUTER INC., Taipei (TW)

(72) Inventors: San-Feng Lin, Taipei (TW); Chen-Sheng Chung, Taipei (TW)

(73) Assignee: ASUSTEK COMPUTER INC., Taipei (TW)

(*) Notice: Subject to any disclaimer, the term of this patent is extended or adjusted under 35 U.S.C. 154(b) by 372 days.

(21) Appl. No.: 15/959,416

(22) Filed: Apr. 23, 2018

(65) Prior Publication Data
US 2018/0310424 A1 Oct. 25, 2018

(30) Foreign Application Priority Data
Apr. 25, 2017 (CN) .......................... 2017 1 0274086

(51) Int. Cl.
| | |
|---|---|
| *H05K 5/04* | (2006.01) |
| *H05K 5/02* | (2006.01) |
| *B32B 15/04* | (2006.01) |
| *B29C 45/14* | (2006.01) |
| *B29L 31/34* | (2006.01) |
| *B21C 23/06* | (2006.01) |
| *B21J 1/02* | (2006.01) |

(52) U.S. Cl.
CPC .......... *H05K 5/04* (2013.01); *B29C 45/14467* (2013.01); *B32B 15/043* (2013.01); *H05K 5/0217* (2013.01); *B21C 23/06* (2013.01); *B21J 1/02* (2013.01); *B29C 2045/14868* (2013.01); *B29L 2031/3481* (2013.01)

(58) Field of Classification Search
CPC .. H05K 5/04; H05K 5/0217; B29C 45/14467; B29C 2045/14868; B32B 15/043; B32B 15/18; B32B 15/20; B21C 23/06; B21J 1/02; B29L 2031/3481; B44C 5/0415
See application file for complete search history.

(56) References Cited

U.S. PATENT DOCUMENTS

| | | | | |
|---|---|---|---|---|
| 4,367,838 | A * | 1/1983 | Yoshida | B23K 20/129 228/114.5 |
| 7,947,900 | B2 * | 5/2011 | Cheng | B32B 15/01 174/50 |
| 2008/0280083 | A1 | 11/2008 | Qiu et al. | |
| 2016/0120046 | A1 | 4/2016 | Ou et al. | |
| 2016/0185067 | A1 * | 6/2016 | Chen | H01Q 1/243 343/702 |

FOREIGN PATENT DOCUMENTS

| | | |
|---|---|---|
| CN | 101304640 A | 11/2008 |
| CN | 101497251 A | 8/2009 |
| CN | 101670742 A | 3/2010 |
| CN | 102026514 A | 4/2011 |
| CN | 104540342 A | 4/2015 |
| TW | 200936370 A | 9/2009 |

* cited by examiner

*Primary Examiner* — Lee A Holly
(74) *Attorney, Agent, or Firm* — McClure, Qualey & Rodack, LLP

(57) ABSTRACT

A method of manufacturing a clad metal casing includes the steps of arranging and connecting metallic materials with different types from each other to form a clad board; shaping the clad board; and post-process the appearance surface of the formed clad board to form the clad metal casing. The appearance surface after the post-process presents surfaces of at least two metallic materials.

9 Claims, 5 Drawing Sheets

101A

201A

101B

201B

METHOD OF MANUFACTURING CLAD METAL CASING

CROSS-REFERENCE TO RELATED APPLICATION

This application claims the priority benefit of CN application serial No. 201710274086.0, filed on Apr. 25, 2017. The entirety of the above-mentioned patent application is hereby incorporated by references herein and made a part of specification.

BACKGROUND OF THE INVENTION

Field of the Invention

The disclosure relates to a method of manufacturing a clad metal casing.

Description of the Related Art

Most casings of electronic devices are made of plastic. Surface treatments are performed on the plastic casings. However, plastic materials provide limited appearance in vision and texture. As a result, different textures are formed on the plastic casings, or different surface treatments are performed on plastic casings to broaden the application. For example, a metal layer is coated on the plastic casing via plastic electroplating, evaporation, or a non-conductive vacuum metallization (NCVM). Surface treatments are performed on a casing made of a single metal by brilliant cutting, laser etching, etching, anodizing, which is not limited herein.

BRIEF SUMMARY OF THE INVENTION

A method of manufacturing a clad metal casing comprises: arranging and connecting metallic materials with different types from each other to form a clad board; shaping the clad board; and post-process an appearance surface of the formed clad board to form the clad metal casing, wherein the appearance surface after the post-process presents surfaces of at least two metallic materials.

According to a method of manufacturing a clad metal casing in embodiments, metallic materials with different types from each other are arranged and combined to form the clad board. Then, the clad board is shaped. A post-process is performed on the appearance surface of the formed clad board. Then, the preset outmost metallic material is presented. Next, a surface treatment is performed. As a result, the clad metal casing is formed via metallic materials with different types from each other with metal brightness and non-plastic feeling in appearance.

BRIEF DESCRIPTION OF THE DRAWINGS

These and other features, aspects and advantages of the invention will become better understood with regard to the following embodiments and accompanying drawings.

DETAILED DESCRIPTION OF THE EMBODIMENTS

Figure 1:
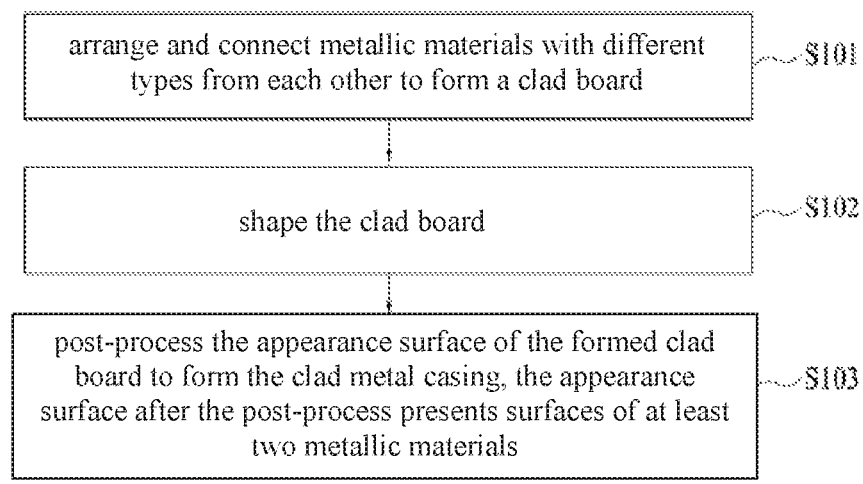
FIG. 1 is a flowchart of a method of manufacturing a clad metal casing in an embodiment.
Figure 2:
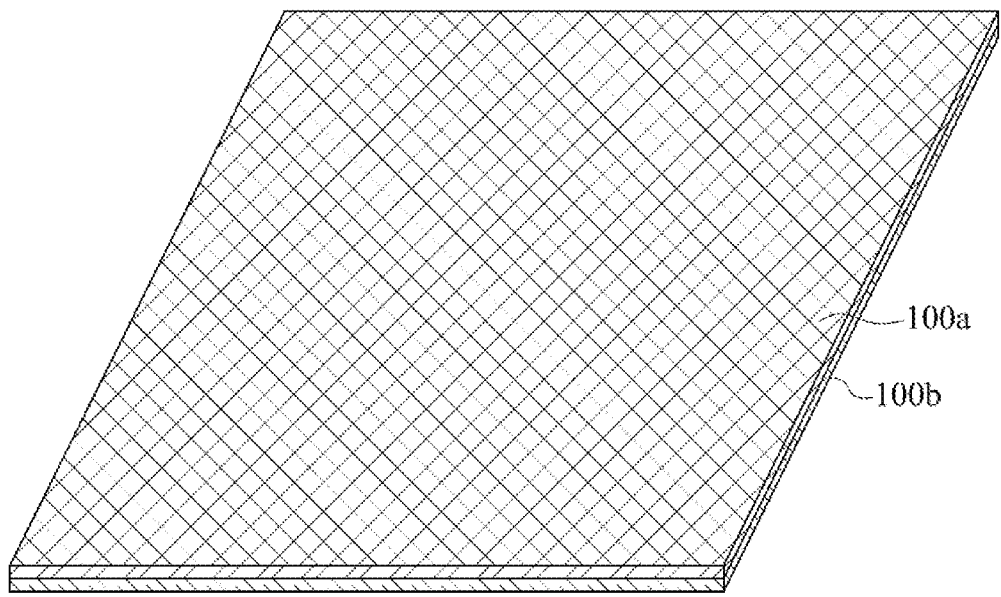
FIG. 2 is a schematic diagram showing a clad board in an embodiment.
Figure 3:
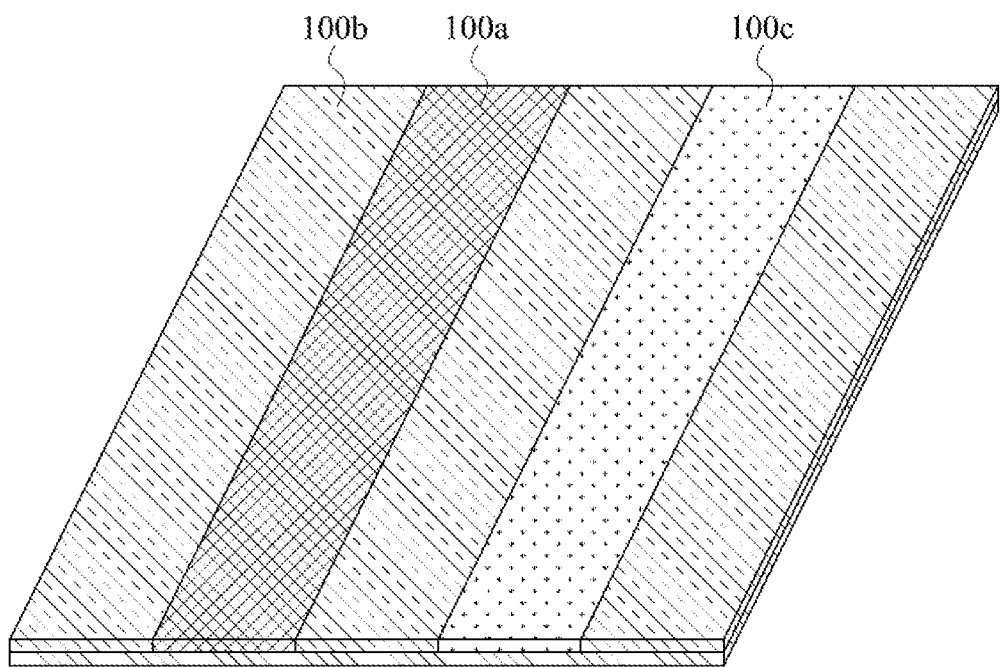
FIG. 3 is a schematic diagram showing a clad board in an embodiment.

FIG. 1 is a flowchart of a method of manufacturing a clad metal casing in an embodiment. As shown in FIG. 1 to FIG. 3, a method of manufacturing a clad metal casing at least includes step S101 to step S103.

In step S101, metallic materials with different types from each other are arranged and connected to form a clad board.

In step S102, the clad board is shaped.

As shown in FIG. 2, a clad board 101A is shown. In the clad board 101A, a metallic material 100a covers a whole surface of another metallic material 100b. The metallic materials 100a, 100b after arranged includes two stack layers.

As shown in FIG. 3, a clad board 201A in another embodiment is shown. Metallic materials 100a, 100b, 100c of the clad board 201A are arranged at a same stack layer. Then, the stack layer covers another stack layer 100b. The arranged metallic materials 100a, 100b, 100c includes two stack layers. The number of the stack layers of the arranged metallic materials 100a, 100b, 100c is not limited herein.

Figure 4:
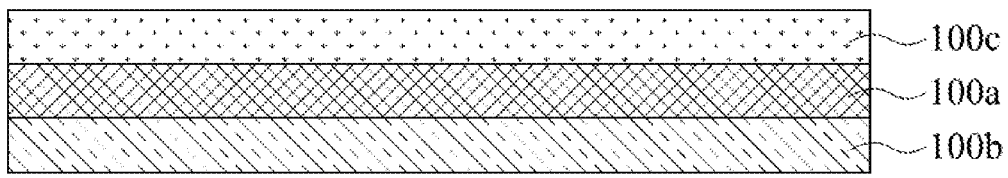
FIG. 4 is a side view of a clad board in an embodiment.
Figure 5:
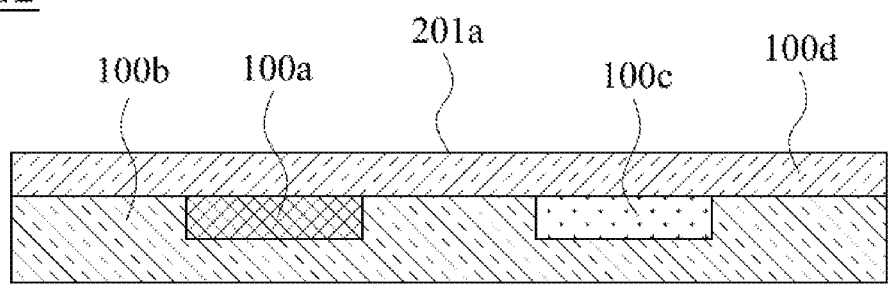
FIG. 5 is a side view of a clad board in an embodiment.

FIG. 4 and FIG. 5 show a side view of the clad board 101B and 201B in embodiments. In contrast with the clad board 101A in FIG. 2, the clad board 101B in FIG. 4 further includes a stack layer 100c at the top. In contrast with the clad board 201A in FIG. 3, the clad board 201B further includes a stack layer 100d.

In an embodiment, the number of the stack layer which is formed after the metallic materials 100a, 100b, 100c, 100d arranged is more than three, which is not limited herein.

In an embodiment, the metallic materials 100a, 100b, 100c, 100d includes gold, argentum, copper, aluminum, nickel, tin, carbon steel, stainless steel, magnesium, titanium, or an alloy including at least one of gold, argentum, copper, aluminum, nickel, tin, carbon steel, stainless steel, magnesium, and titanium, which is not limited herein.

In an embodiment, in step S102, the clad board is formed via a stamping process, a forging process, a rolling process, or an extrusion process, which is not limited herein.

In step S103, a post-process is performed on the appearance surface of the clad board to form the clad metal casing. The appearance surface after the post-process presents surfaces of at least two metallic materials.

Figure 6:
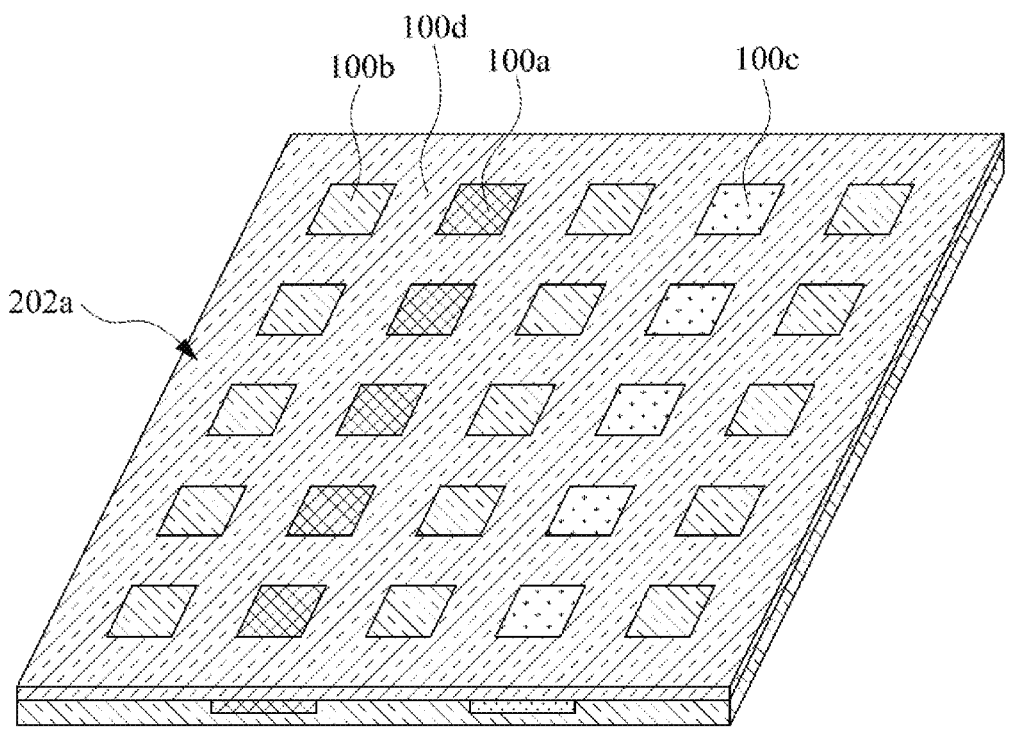
FIG. 6 is a schematic diagram showing a clad metal casing in an embodiment.

FIG. 6 is a schematic diagram showing a clad metal casing 202 in an embodiment. After the step S102 and the step S103 are performed on the clad board 201B in FIG. 5, the clad metal casing 202 in FIG. 6 is formed.

In an embodiment, the post-process includes a grinding process, a CNC process, a laser carving process, an etching treatment, a drawing process, or a sand blasting process, which is not limited herein.

Figure 7:
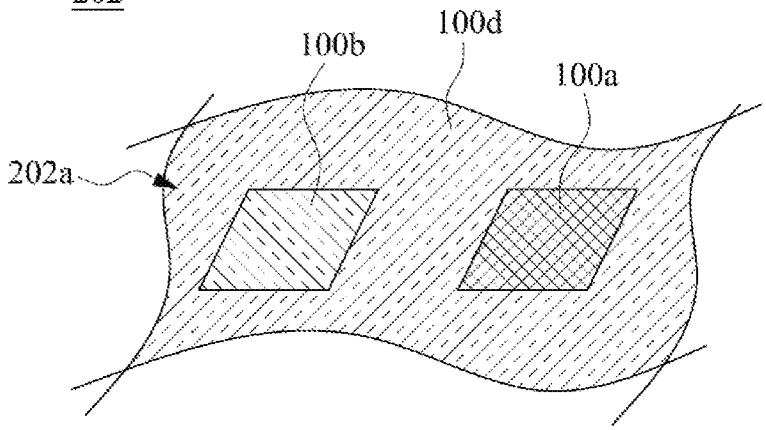
FIG. 7 is a partial enlarged view of a clad metal casing in FIG. 6 along a segment 7-7 in an embodiment.

FIG. 7 is a partial enlarged view of a clad metal casing 202 in FIG. 6 along a segment 7-7 in an embodiment. As shown in FIG. 7, the surface of the metallic materials 100a, 100b, 100d presented at the appearance surface 202a (which is the appearance surface 201a in FIG. 5 after the post-process) after the post-process is flush, which is not limited herein.

Figure 8:
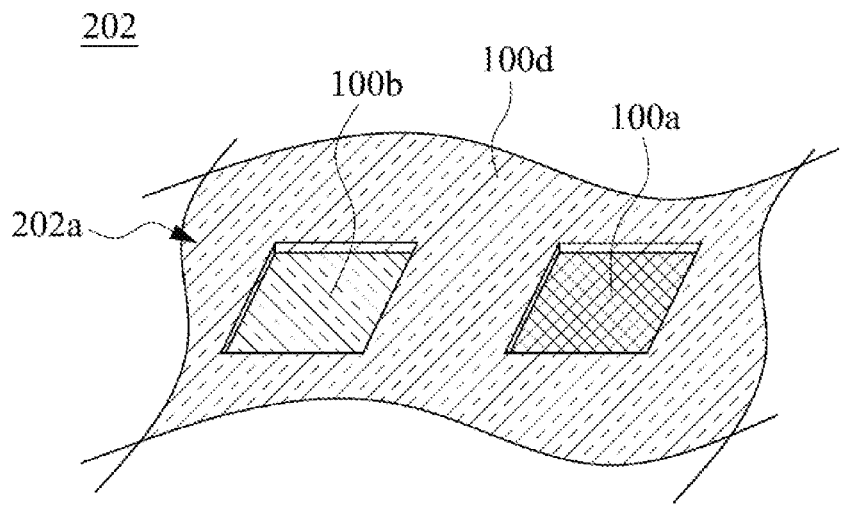
FIG. 8 is a partial enlarged view of a clad metal casing in FIG. 6 along a segment 7-7 in an embodiment.
Figure 9:
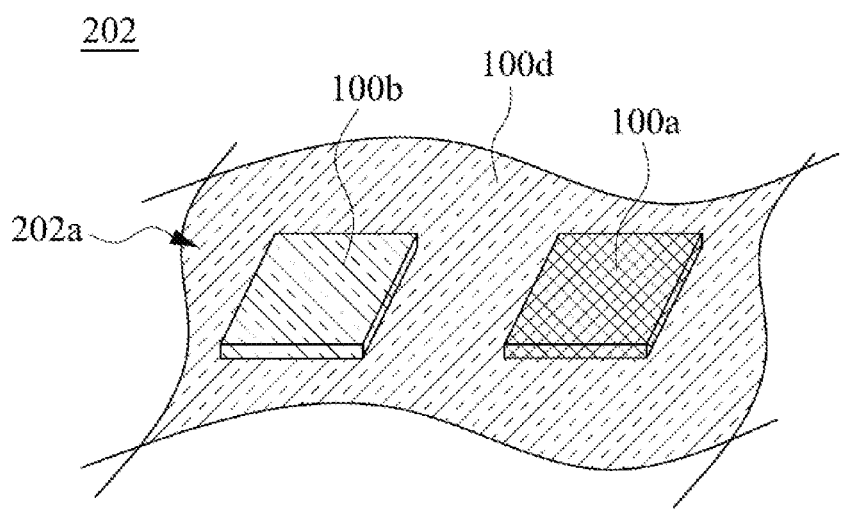
FIG. 9 is a partial enlarged view of a clad metal casing in FIG. 6 along a segment 7-7 in an embodiment.

Please refer to FIG. 8 and FIG. 9. FIG. 8 and FIG. 9 are partial enlarged views of a clad metal casing 202 in FIG. 6 along a segment 7-7 in embodiments. As shown in FIG. 8, the surfaces of the metallic materials 100a, 100b at the appearance surface 202a after the post-process is concave in contrast with that of the metallic materials 100d. As shown in FIG. 9, the surfaces of the metallic materials 100a, 100b at the appearance surface 202a after the post-process is concave in contrast with that of the metallic materials 100d.

In an embodiment, the method of manufacturing the clad metal casing further includes a step S104. In step S104, a surface treatment is performed at the appearance surface (the appearance surface is already processed via the post-process).

In an embodiment, the surface treating includes a laser carving process, sputtering, an anodic treatment, an etching treatment, a UV spraying treatment, and electrophoresis color process, which is not limited herein.

In an embodiment, the section of the clad board 101B, 201B is directly used as the appearance surface of the clad metal casing 202.

In an embodiment, the outmost stack layer of the clad board 101B, 201B (that is the top layer made of the metallic materials 100d) is replaced by a plastic material. That is, in step S101 in an embodiment, the arranged metallic materials are combined with a plastic material to form the clad board. Then, the appearance surface after the post-process presents the surface of a plastic material and at least two metallic materials. In an embodiment, the appearance surface after the post-process includes presents the surface of a plastic material and one metallic material.

According to a method of manufacturing a clad metal casing in embodiments, metallic materials with different types from each other are arranged and connected to form a clad board. Then, the clad board is shaped. A post-process is performed on the appearance surface of the formed clad board. Then, the preset outmost metallic material is presented. Next, a surface treatment is performed. As a result, the clad metal casing is formed via metallic materials with different types from each other, and the appearance has metal luster with a high-quality feeling.

Although the invention has been disclosed with reference to certain embodiments thereof, the disclosure is not for limiting the scope. Persons having ordinary skill in the art may make various modifications and changes without departing from the scope of the invention. Therefore, the scope of the appended claims should not be limited to the description of the embodiments described above.

What is claimed is:

1. A method of manufacturing a clad metal casing, comprising:
   arranging and connecting metallic materials with different types from each other to form a clad board;
   shaping the clad board; and
   performing a post-process on a surface of the formed clad board, and presenting a surface with at least two metallic materials.

2. The method of manufacturing the clad metal casing according to claim 1, further comprising:
   performing a surface treatment on the post-processed.

3. The method of manufacturing the clad metal casing according to claim 2, wherein the surface treatment is selected from the group consisting of: a laser carving process, sputtering, an anodic treatment, an etching treatment, a UV spraying treatment, and electrophoresis color process.

4. The method of manufacturing the clad metal casing according to claim 1, wherein the clad board is formed via a process selected from the group consisting of: stamping process, a forging process, a rolling process, and an extrusion process.

5. The method of manufacturing the clad metal casing according to claim 1, wherein the step of arranging and connecting the metallic materials with different types from each other to form the clad board further comprises:
   arranging the metallic materials at a plurality of stack layers, wherein at least one of the stack layers includes two of the metallic materials.

6. The method of manufacturing the clad metal casing according to claim 1, wherein the metallic materials are selected from the group consisting of: gold, argentum, copper, aluminum, nickel, tin, carbon steel, stainless steel, magnesium, titanium, and an alloy above.

7. The method of manufacturing the clad metal casing according to claim 1, wherein the post-process is selected from the group consisting of: a grinding process, a CNC process, a laser carving process, an etching treatment, a drawing process, and a sand blasting process.

8. The method of manufacturing the clad metal casing according to claim 1, wherein the surfaces of the at least two metallic materials presented after the post-process is in the same plane.

9. The method of manufacturing the clad metal casing according to claim 1, wherein the surfaces of the at least two metallic materials presented after the post-process is not in the same plane.

* * * * *